(12) United States Patent
Ivry

(10) Patent No.: US 6,686,799 B2
(45) Date of Patent: Feb. 3, 2004

(54) BURST MODE LIMITER-AMPLIFIER

(75) Inventor: Raanan Ivry, Haifa (IL)

(73) Assignee: Broadlight Ltd. (IL)

( * ) Notice: Subject to any disclaimer, the term of this patent is extended or adjusted under 35 U.S.C. 154(b) by 0 days.

(21) Appl. No.: 10/289,373

(22) Filed: Nov. 7, 2002

(65) Prior Publication Data

US 2003/0092411 A1 May 15, 2003

Related U.S. Application Data

(60) Provisional application No. 60/331,050, filed on Nov. 7, 2001.

(51) Int. Cl.[7] .............................................. H04H 10/60
(52) U.S. Cl. ........................................ 327/560; 327/563
(58) Field of Search ........................... 327/551, 553, 327/554, 552, 558, 559, 560; 330/110

(56) References Cited

U.S. PATENT DOCUMENTS 4,437,067 A * 3/1984 McKenzie et al. .......... 327/554
5,412,498 A * 5/1995 Arstein et al. .............. 359/189
5,466,976 A * 11/1995 Ichihara ..................... 333/173
6,337,887 B1 * 1/2002 Oono ......................... 330/260

* cited by examiner

Primary Examiner—Dinh T. Le
(74) Attorney, Agent, or Firm—Piper Rudnick LLP; Jerold I. Schneider

(57) ABSTRACT

A limiter-amplifier device usable for burst mode communications. In one variation, the device includes a resistor bypassable via a switch, a capacitor, and a limiter-amplifier in series. In operation, in a first phase, the capacitor is discharged to ground via switches. In a second phase, the resistor is bypassed and the capacitor is charged while between the received signal and ground, via switching. In a third phase, in a fast tracking mode, the resistor is bypassed, and the capacitor is placed in series with the limiter-amplifier via switching, and in a slow tracking mode, the resistor is not bypassed, such that the resistor and capacitor are in series with the limiter-amplifier. In additional variations, the resistor is so placed such that less switching functions are needed to bypass the resistor, and additional resistors are optionally used in series with the switches to avoid exceeding current limitations for the switches.

28 Claims, 9 Drawing Sheets

| $R_{S1}$ | $R_{S2}$ | $R_L$ | $\Delta$ | $V_{th}/V_H$ | $t_2/t_1$ |
|---|---|---|---|---|---|
| 15 | 35 | 50 | 20% | 0.55 | 1.86 |

BURST MODE LIMITER-AMPLIFIER

This application claims priority from U.S. Provisional Patent Application Ser. No. 60/331,050 filed Nov. 7, 2001. The entirety of that provisional application is incorporated herein by reference.

BACKGROUND OF THE INVENTION

1. Field of the Invention

The present invention relates to burst mode limiter-amplifier devices, and in particular to limiter-amplifier devices for variable mode use with burst mode and continuous optical communications.

2. Background of the Technology

In the existing art, most optical receivers and optical communications involve continuous mode communication. One new method for optically communicating involves burst mode communication. Burst mode communication is useful, for example, for point to multipoint communication, such as occurs when a single operator is linked to many users. In the prior art, for example, many users are connected to a single operator using fiberoptic lines that are split among the users: typically, for example, one fiber is split to local fibers that are in turn coupled to optical users. In order to prevent interference among the users, every user transmits using a different carrier. Thus, at multiple times, the user communication is quiet, then the user starts a burst of transmission, and then the user shuts down again, waiting for a next period for transmission.

The difficulties of receiving and distinguishing among receivers is exacerbated by typically large variations in the magnitude of power of the bursts among different users. FIG. 1 is a graphical representation demonstrating a low power burst following a high power burst, as typically occurs in a burst communication, as is known in the art. As shown in the example of FIG. 1, the power difference between two successive bursts can be about 15–25 dB. Also, as shown in FIG. 1, the high power burst 1 can raise the average power level of a sequentially following low power burst 2, which decays slowly over time. There are a number of reasons for the slow decay in the power of a burst, including the following: 1) finite bandwidth of the circuits before and after the TIA; 2) turn off time of the laser diode (LD) and LD driver; and/or 3) turn off time of the P-I-N avalanche photodiode (APD). The decay time, together with the physical (PHY) definitions (i.e., guard time, preamble length) determine if there is a need to treat this phenomenon.

These phenomena make the receiver implementation much more difficult, and the usual architecture of the prior art for continuous mode implementations, shown in FIG. 2, fails to operate properly for burst mode communications. As shown in FIG. 2, a typical optical receiver 20 of the prior art, which identifies signals by virtue of a technique known as alternating current (AC) coupling, includes three primary components. The first component is a transimpedence amplifier (TIA) 22. The TIA 20 receives the typically weak signal output from the optical detector coupled, for example, to an optical fiber line, and amplifies the signal. Next, the device must discriminate between a high level and a low level signal that is received, the optical signal typically including "on/off keying," which consists of transmitted "on" signals (also referred to as "ones") and "off" signals (also referred to as "zeros"). With an optical device, the transmitted "on" signal ("one") is a pulse of light, while the transmitted "off" signal ("zero") is the non-transmittal of light. The current produced by the received light is amplified by the TIA 22, and a capacitor 23 filters the noise from the amplified signal (i.e., removes the direct current (DC) portion of the signal).

Since the data is transmitted in bursts, a problem arises in that the receiver must receive and distinguish bursts of data. The receiver must recognize each transmitter that transmits data, and the receiver typically must estimate the power of the data to distinguish among bursts. In order to make this determination, the receiver must acquire the signal for the data burst within a short time period at the beginning of the burst.

In the prior art, continuous mode transmission and reception has typically been used with two station transmitters, for which data are continuously transmitted—no stopping and starting of data occurs, as is the case with burst mode transmission. As a result, in prior art continuous transmission, it has not mattered how long it takes for the receiver to acquire the signal.

There remain a number of unmet needs in the prior art for using limiter-amplifiers for burst mode communications. One problem with the limiter-amplifiers of the prior art is that filtering the signal takes time, which slows signal transmission. Another problem with the prior art is that limiter-amplifier devices cannot be readily or easily adapted to different types of signals (e.g., differing acquisition periods).

SUMMARY OF THE INVENTION

The present invention includes a limiter-amplifier device usable for burst mode communications with variable acquisition periods. In one embodiment, the device includes a resistor bypassable via, for example, a switching device (e.g., a single pole switch; a transistor; or other devices known in the art; hereinafter referred to interchangeably as a "switch"), a capacitor, and a limiter-amplifier in series within the device. In operation, in a first phase (reset), the capacitor is discharged to ground via a pair of switches, each of which is operable so as to connect a side of the capacitor to ground. In a second phase, the resistor is bypassed (via, for example, a third switch), and the capacitor is charged to a threshold voltage between the received signal and ground, via opening of a first one of the switches used for discharging the capacitor.

The third phase includes a fast tracking mode and a slow tracking mode. In the fast tracking mode, the resistor is bypassed, and the capacitor is placed in series with the limiter-amplifier via opening of the first capacitor discharge switch and via moving of the second switch to a position coupling the capacitor to the limiter-amplifier. In the slow tracking mode, the resistor is not bypassed, by, for example, leaving the third switch open, and the resistor and capacitor thus are in series with the limiter-amplifier.

In a second embodiment, the resistor is so placed that less switching functions are needed to bypass the resistor. In this embodiment, single pole switches, for example, are situated on either side of the capacitor, so as to allow discharge to ground by closing of these switches in the first phase. The resistor is positioned in series between the second side of the capacitor and the limiter-amplifier. In the second phase, the first capacitor side switch is opened, and the second capacitor side switch is left closed to ground, allowing fast charging of the capacitor. In the third phase, both switches are opened, such that the capacitor is in series with the resistor and the limiter-amplifier. In this embodiment, additional resistors are optionally used in series with the switches to avoid exceeding current limitations for the switches.

The present invention overcomes problems of the prior art relating to input from the TIA causing difficulties for the limiter-amplifier, such as the following: 1) the input has high DC level, (Common mode, in the case of differential amplifier), which can change from burst to burst; and 2) the non-linearity causes a duty-cycle distortion, especially for large signals. The present invention solves the first of these difficulties by providing two or more time constants via variable resistances in the circuit, a short time constant for acquisition during the preamble reception and longer time constant for tracking. Moving from one time constant to the other is controlled in various embodiments of the present invention via use of switches in the device.

Additional advantages and novel features of the invention will be set forth in part in the description that follows, and in part will become more apparent to those skilled in the art upon examination of the following or upon learning by practice of the invention.

DETAILED DESCRIPTION

With burst communications, typically, communications are received from many different users, with each burst potentially being received from a different user. In addition, the magnitude of the high level signal typically varies among the users (e.g., a variation of greater than an order of magnitude can occur among users). The variation in magnitude of signal can thus be used to identify a burst, but the identification must be made quickly during the burst communication so as to avoid delays in transmission.

The present invention includes a limiter-amplifier that provides a technique for filtering signals in a manner that is tailored to the burst mode communications received. In an embodiment of the present invention, transmission delay due to filtering can be minimized by tailoring the capacitance in the limiter-amplifier device. In general, a higher value capacitor allows the device to be used with longer acquisition periods for signals, while a smaller value capacitor allows the device to be used with shorter acquisition periods. However, a fast capacitor may also distort the signal or otherwise cause a problem with the transmitted signal. For example, the smaller capacitor may cause performance degradation and problems with large sequences of received 1's and 0's.

Burst mode communications typically include two signal portions of importance to the present invention: 1) a header, also known as a preamble; and 2) the data. In an embodiment of the present invention, the preamble is defined for all users, and in order to properly process the data of the signal, the limiter-amplifier filters the signal in the length of time it takes for the preamble to be processed.

In general, the time period associated with the appropriate capacitor value for a given signal frequency varies as a function of the capacitance in the device and the resistance in the device. The time period (T) is proportional to the product of the resistance (R) and the capacitance (C): T~RC. The present invention allows the time period (T) to be variably adjusted by adjusting the values of R and T within the burst mode limiter-amplifier, so as to allow filtering to be appropriately determined during processing of the header of the signal.

Figure 3:
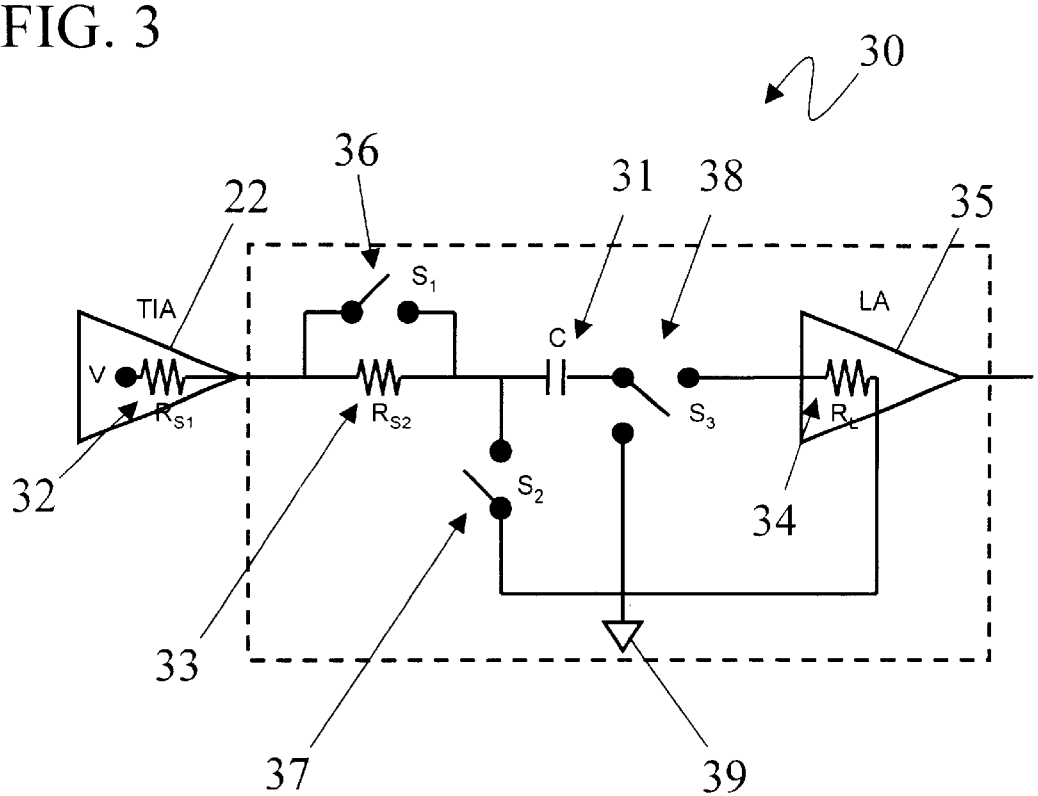
FIG. 3 presents a representative circuit diagram of an example burst mode limiter-amplifier device usable for burst mode communications, in accordance with a first embodiment of the present invention.

FIG. 3 shows an example limiter-amplifier device usable with burst mode communications that allows variation in the periodicity associated with the device, in accordance with the present invention. As shown in FIG. 3, the time period (T) associated with the circuit 30 is variable as a function of the resistance in series with the capacitor 31 of the circuit. For example, the TIA 22 includes an associated resistance $R_{S1}$ 32. The device 30, as shown in FIG. 3, also includes a bypassable resistor $R_{S2}$ 33 in series with the capacitor 31, and a resistance $R_L$ 34 associated with the limiter-amplifier component 35. Also included in the device 30 are three switches 36, 37, 38. The first switch ($S_1$) 36, which is a single pole switch, is located in parallel with the resistor $R_{S2}$. The second switch ($S_2$) 37, which is also a single pole switch, is coupled on one end to a first side of the capacitor 31 and on the other end to ground 39. The third switch ($S_3$) 38, which is a double pole switch, is coupled on one side to the second side of the capacitor 31, on a first terminal to the limiter-amplifier 35, and on a second terminal to ground 39. By opening and closing the switches 36, 37, 38, the amount of resistance in series with the capacitor 31 can be varied. In one embodiment of the present invention, the typical value of each of the resistors 32, 33, 34 is about 50Ω.

The effect of the capacitor 31 on the signal received by the device is to convert the signal from low of zero and a high of the upper signal to a negative maximum and a positive maximum filtered signal, wherein the magnitude of the filtered signal in each direction is one half the maximum unfiltered signal (e.g., converts an unfiltered signal that varies between 0 and 1 unit of magnitude to a filtered signal that varies between −0.5 and 0.5 units). The filtered signal is then fed from the capacitor 31 to the limiter-amplifier 35.

The limiter-amplifier 35 discriminates between the low and high signals transmitted, and then uses an identified midpoint between the low and high signals to determine when and on and off signal are transmitted. The identified midpoint of the signal is useful for determining whether an on or off signal is received because the midpoint is equally distanced from both the low signal and the high signal, each of which typically includes or is affected by noise. By using the midpoint as the threshold between these two noisy signals, the effect of the noise from each signal is minimized.

Figure 4:
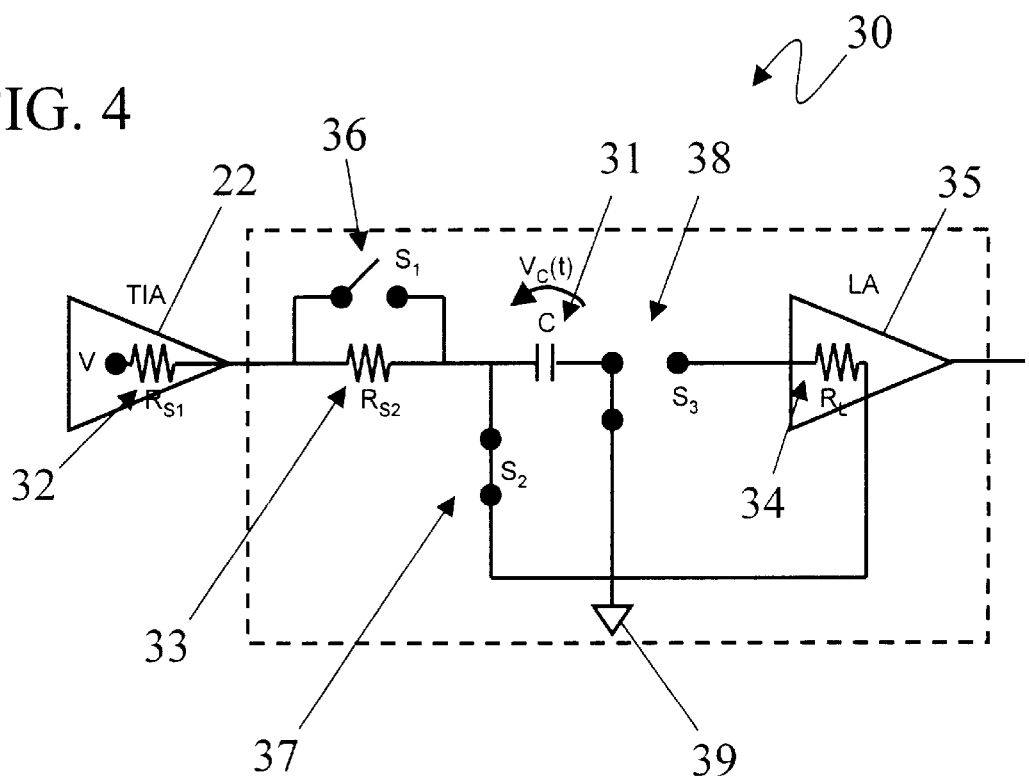
FIG. 4 shows the example limiter-amplifier device of FIG. 3 in a first phase for resetting the device.

FIG. 4 presents a first phase for the device 30, in which the capacitor 31 is discharged to ground 39. In this phase, the first switch $S_1$ 36 is placed in an open position, as shown in FIG. 4. The second switch $S_2$ 37 is placed in a closed position, as shown in FIG. 4, such that the first side of the capacitor 31 is coupled to the ground 39, and will discharge any charge stored on this side of the capacitor 31. The third switch $S_3$ 38 is placed in a first pole position, as shown in FIG. 4, such that the second side of the capacitor 31 also is coupled to ground 39, and such that any charge stored on the second side of the capacitor 31 is discharged.

Figure 5:
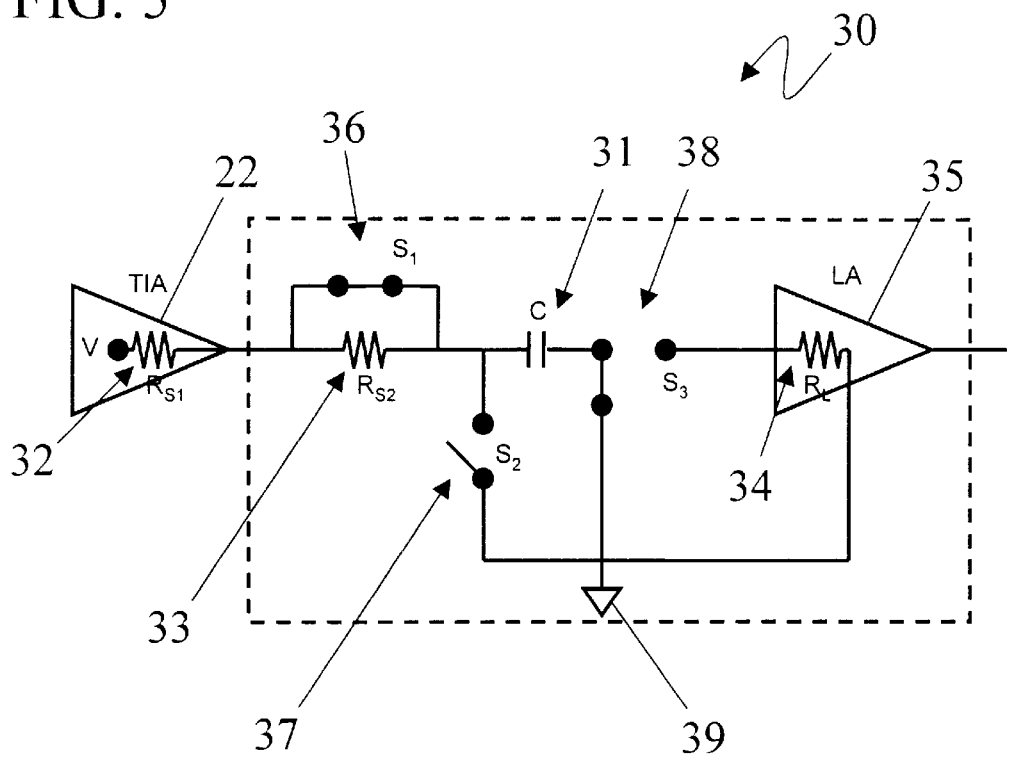
FIG. 5 contains the example limiter-amplifier device of FIG. 3 in a second phase for charging a capacitor within the device to a threshold voltage.

Following discharge of the capacitor 31, the first switch $S_1$ 36 is moved to the closed position, as shown in FIG. 5, so as to bypass the resistor $R_{S2}$ 33, the second switch $S_2$ 37 is moved to the open position, as shown in FIG. 5, and the third switch $S_3$ 38 is left in the first pole position, as shown in FIG. 5, so as to couple the second side of the capacitor 31 to ground 39. In this second phase, as shown in FIG. 5, which is referred to in some embodiments as the "fast charging state," the time period $T_1$ associated with the device 30 in this state is proportional only to a product of the resistance of resistor $R_{S1}$ and capacitance of capacitor C 38:

$$T_1 \sim R_{S1} \cdot C$$

As the resistance in series with the capacitor 31 is minimal, the resulting time period $T_1$ is minimal for the device 30 in this second phase.

In an embodiment of the present invention, the amount of time that device 30 is in the second phase, as shown in FIG. 5, varies depending on the time constant that results for the capacitance selected for the capacitor 31. In the second phase, the inductance of the capacitor 31 has been selected and the time period of the second phase has been selected as sufficiently long, such that the capacitor 31 becomes charged to a threshold voltage ($V_{th}$) that is halfway between the high voltage ($V_H$) and low voltage ($V_L$) of the signals during the time that the device 30 is in the second phase (e.g., half of the high voltage value if the low voltage value is zero), according to the following formula:

$$V_{th} = (V_H + V_L)/2$$

where $V_{th}$ = threshold voltage;

$V_H$ = high voltage level at TIA output; and $V_L$ = low voltage level at TIA output.

As is known in the art, because the time constant is the smallest in the second phase, due to the minimal resistance that is in series with the capacitor 31, the capacitor 31 functions so as to average the charge stored on the capacitor 31 producing a voltage halfway between the high and low voltages of the signal.

As discussed above, during the second phase, as shown in FIG. 5, the capacitor 31 is charged to the threshold voltage ($V_{th}$). The preamble at this stage is high for faster charging. The following formula is used to find the acquisition time:

$$V_C(t) = V_H \left(1 - e^{-\frac{1}{R_{S1} \cdot C}}\right) = V_{th}$$

Figure 6:
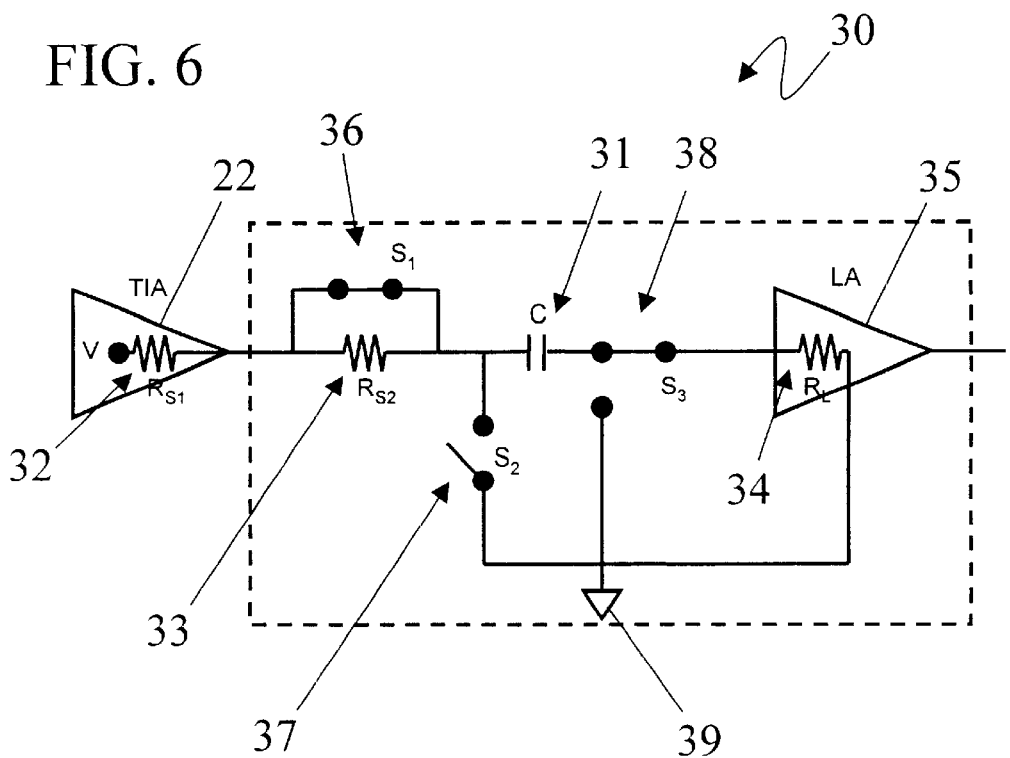
FIG. 6 presents the example limiter-amplifier device of FIG. 3 in a third phase for transmitting a signal in a fast tracking mode.
Figure 7:
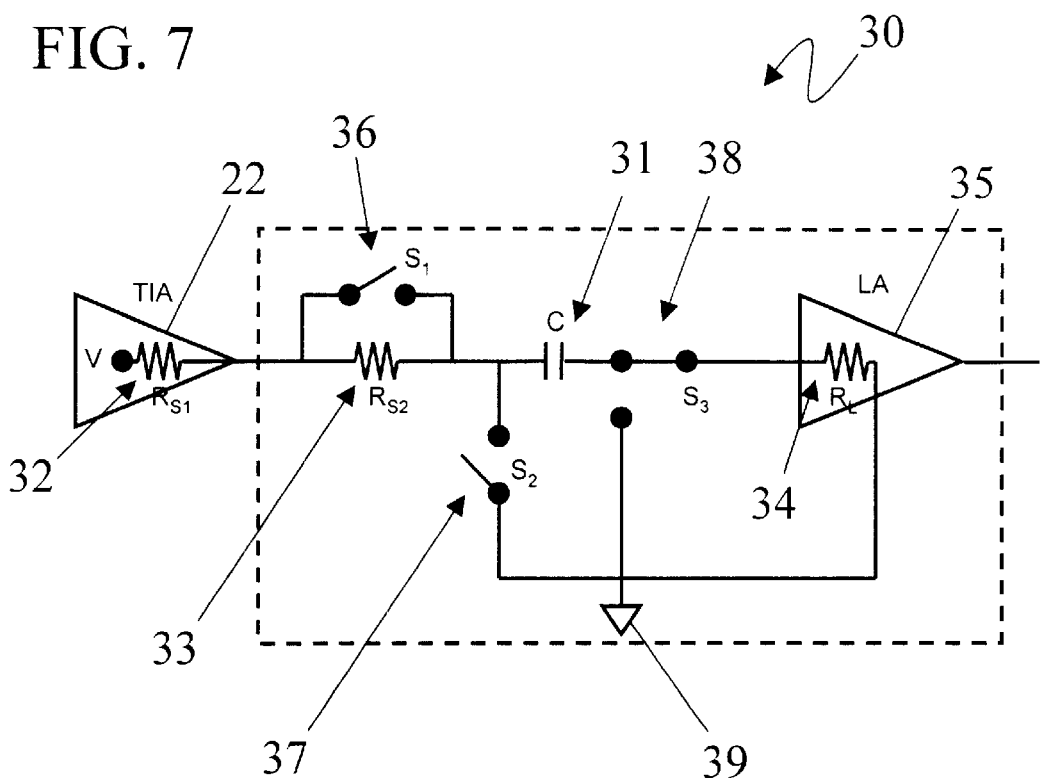
FIG. 7 shows the example limiter-amplifier device of FIG. 3 in a third phase for transmitting a signal in a slow tracking mode.

In a third phase, as shown in FIGS. 6 and 7, the device 30 is able to be set or preset in either a fast tracking mode or a slow tracking mode. In a fast tracking mode, as shown in FIG. 6, switch $S_3$ 38 is placed in the second pole position, as shown in FIG. 6, and resistor $R_{S2}$ is bypassed via closing of switch $S_1$ 36. In the fast tracking mode, as shown in FIG. 6, the capacitor 31 is thus placed in series only with resistor $R_{S1}$ and resistor $R_L$, and thus the time period $T_2$ associated with the device 30 in the fast tracking mode is shorter than the time period $T_3$ associated with the slow tracking mode, as discussed with regard to FIG. 7, below. This time period $T_2$ is as follows:

$$T_2 \sim (R_{S1} + R_L) \cdot C$$

In a slow tracking mode, as shown in FIG. 7, switch $S_3$ 38 remains in the second pole position, as shown in FIG. 7, but resistor $R_{S2}$ is not bypassed, as switch $S_1$ 36 is left open. In the slow tracking mode, as shown in FIG. 7, the capacitor 31 is thus placed in series with resistor $R_{S1}$ and resistor $R_L$, as well as resistor $R_{S2}$, and thus the time period $T_3$ associated with the device 30 is longer than the time period $T_2$ associated with the fast tracking mode, as follows:

$$T_3 \sim (R_{S1} + R_L + R_{S2}) \cdot C$$

In one embodiment of the present invention, the device 30 may be optionally operated in either slow tracking mode or fast tracking mode. In one embodiment, the mode is selected based on system design requirements/parameters, given a selected value of capacitor 31 and applicable resistances within the device 30. For example, the same device 30 can be used for either continuous mode signal reception (e.g., placed in slow tracking mode) or for burst mode signal reception (e.g., placed in fast tracking mode).

In the slow tracking phase, as shown in FIG. 7, the capacitor 31 is generally maintained at an average voltage. Assuming the received signal begins at a threshold voltage ($V_{th}$) and then receives a signal that includes one or more zero voltage pulses, the following formula is usable to relate time to a change ($\Delta$) in the threshold voltage ($V_{th}$):

$$V_C(t) = V_H \left( e^{-\frac{1}{(R_{S1}+R_{S2}+R_L) \cdot C}} \right) = V_{th}(1 - \Delta)$$

Applying the following:
for $t_1$=acquisition time $$t_1 = -R_{S1} \cdot C \cdot \ln(1 - V_{th}/V_H)$$

for $t_2$=time to have $\Delta$ error because of identical bit sequence $$t_2 = -(R_{S1}+R_{S2}+R_L) \cdot C \cdot \ln(1-\Delta)$$

And, therefore, $t_2/t_1$, the ratio between the acquisition time and the time to acceptable error $\Delta$ is as follows:

$$\frac{t_2}{t_1} = \frac{(R_{S1} + R_{S2} + R_L)}{R_{S1}} \cdot \frac{\ln(1 - \Delta)}{\ln(1 - V_{th}/V_H)}$$

Figures 8, 9:
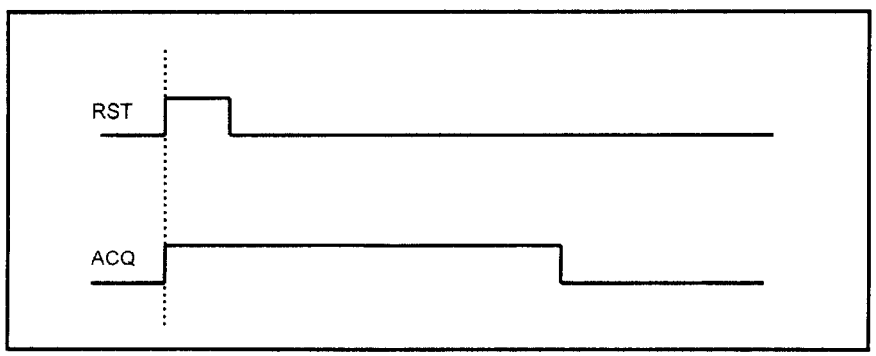
FIG. 8 is a table of sample values for use in determining acceptable error for an example limiter-amplifier usable with burst mode communications, in accordance with an embodiment of the present invention.
FIG. 9 is a graphical representation of reset signal and acquisition signal for controlling operation of a limiter-amplifier usable with burst mode communications, in accordance with an embodiment of the present invention.

The table shown in FIG. 8 contains sample values for variables for the above identified ratio, in accordance with an embodiment of the present invention. In the table of FIG. 8, with the given circuit parameters, for example, for a preamble length (n), a 20% threshold error will occur in the event of a sequential series of 1.86n zeros or ones (the actual number will vary as a function of the capacitance of capacitor 31). To decrease the error, a greater value capacitance for capacitor 31 or a larger preamble can be used. Alternatively, to decrease the impact of the threshold error, a greater value resistance for $R_{S1}$, for example, can be used.

In an embodiment of the present invention, existing semiconductor or other devices are usable as the switches of the device of the present invention. Such existing devices include, but are not limited to, negative controlled switches and P-channel metal-oxide semiconductor field effect transistors (MOSFETs). For example, an AS006L1-00 (A) negative controlled switch, made by Insight Memec, a division of Memec Group having American headquarters in San Diego, Calif., may be used by connecting only the J2 pin to the device of the present invention. The V2 pin is connected to ground. When the V1 pin is connected to zero voltage, the J1 pin shorts to ground. When −5 volts are applied to the V1 pin, the J1 pin produces an open circuit. Alternatively, the AS006L1-00 (A) device can be used via the J2 pin by connecting the V1 pin to the V2 pin and grounding the J1 pin.

In one embodiment, to control the burst mode limiter-amplifier device of an embodiment of the present invention, two control signals are used: 1) a reset signal (RST); and 2) an acquire signal (ACQ), as shown in FIG. 9. In an embodiment of the present invention, as shown in FIG. 9, the RST and ACQ signals are communicated to the device at about the same time (the graphical representation of the RST and ACQ signals are shown with magnitude of signal in the vertical direction and time in the horizontal direction, as shown in FIG. 9). The ACQ remains high until the end of the acquisition phase. In an embodiment of the present invention, the reset signal is communicated for the minimum amount of time necessary to discharge the capacitor to ground, in accordance with, for example, the example device shown in FIG. 4, and the time period for the acquisition signal is of a determined appropriate length (e.g., calculated given the values of the various components of the device) so as to correspond closely to the length of the preamble period of the transmitted signal.

Figure 10:
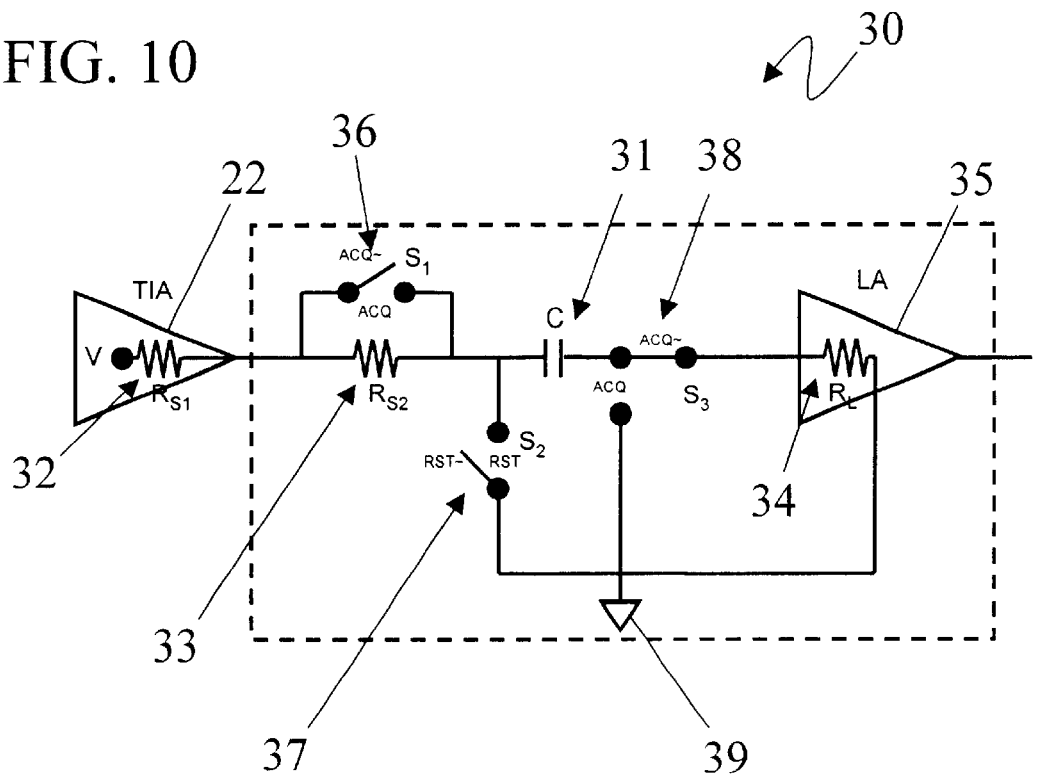
FIG. 10 contains the example limiter-amplifier device of FIG. 3, showing reset and acquisition signal information for the various switches, in accordance with one embodiment of the present invention.

The connection between the control signals and the different switches, in accordance with an embodiment of the present invention, is shown in FIG. 10. In FIG. 10, during receipt of the RST signal, switch $S_2$ 37 is in the closed position (as designated in FIG. 10 by the positioning of the "RST" notation), and during receipt of no RST signal, switch $S_2$ 36 is in the open position (as designated in FIG. 10 by the positioning of the "RST~" notation). Similarly, during receipt of the ACQ signal, switch $S_1$ 36 is in the closed position and switch $S_3$ 38 is in the lower position, as shown in FIG. 10 (the ACQ signal received position of each of the switches $S_2$ 36 and $S_3$ 38 is designated by the "ACQ" notation), and during receipt of no ACQ signal, switch $S_1$ 36 is in the open position and switch $S_3$ 38 is in the upper position, as shown in FIG. 10 (the no ACQ signal received position of each of the switches $S_2$ 36 and $S_3$ 38 is designated by the "ACQ~" notation). Note that the RST and ACQ signals shown in FIGS. 8 and 9 thus produce switching and other activity in the device that corresponds to the various phases described above.

Figure 1:
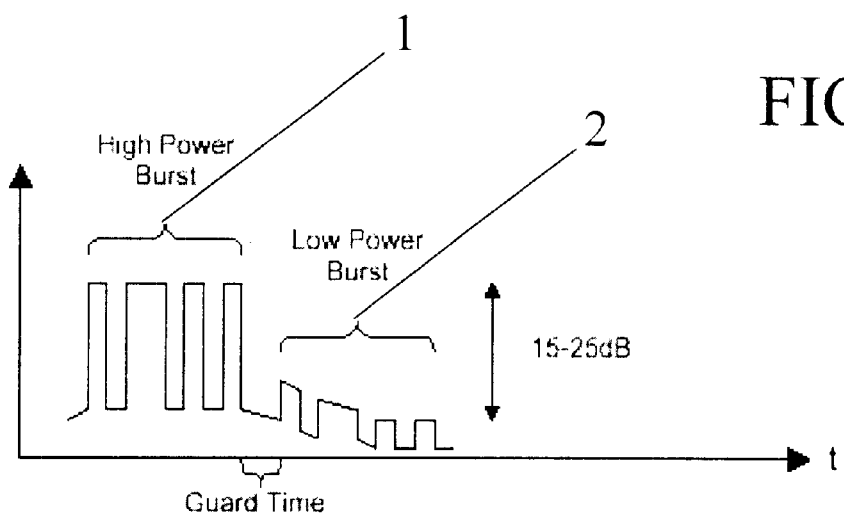
FIG. 1 illustrates an example high power burst, followed by low power burst transmission of a signal, as is known in the art.
Figure 2:
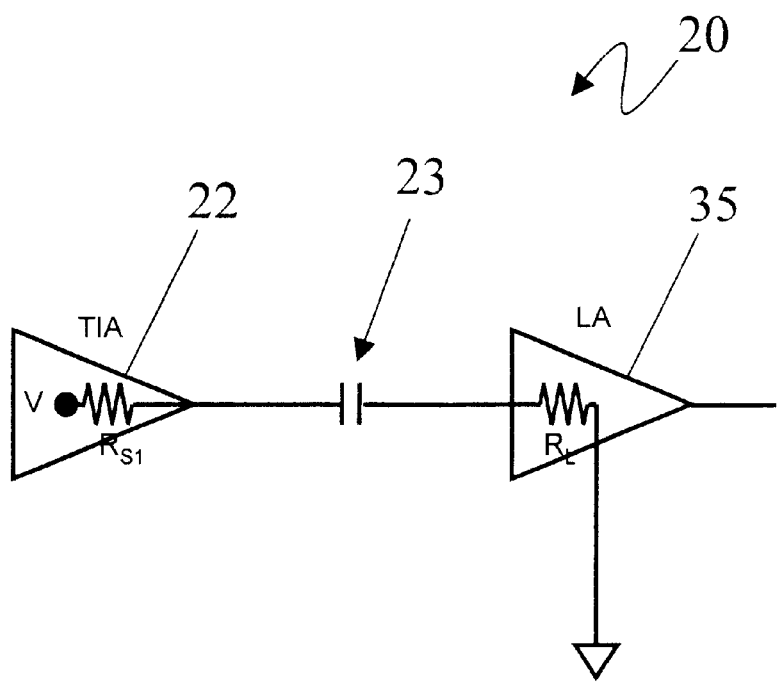
FIG. 2 is an example prior art limiter-amplifier circuit.
Figure 11:
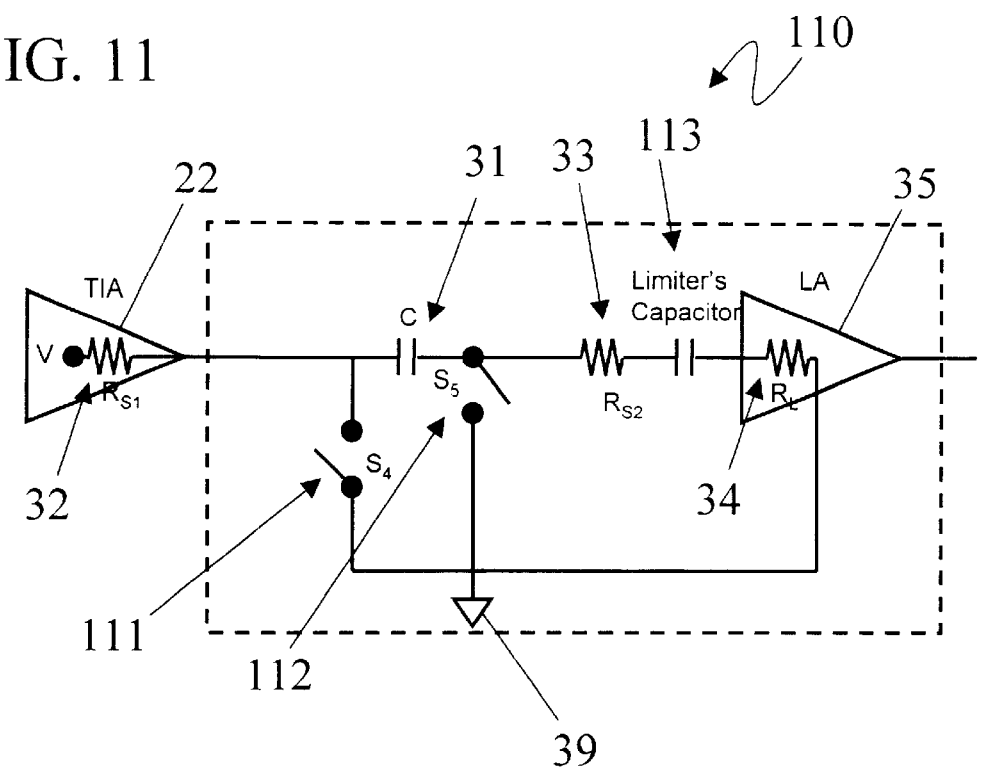
FIG. 11 presents a representative circuit diagram of an example limiter-amplifier device usable with burst mode communications, in accordance with a second embodiment of the present invention.
Figure 12:
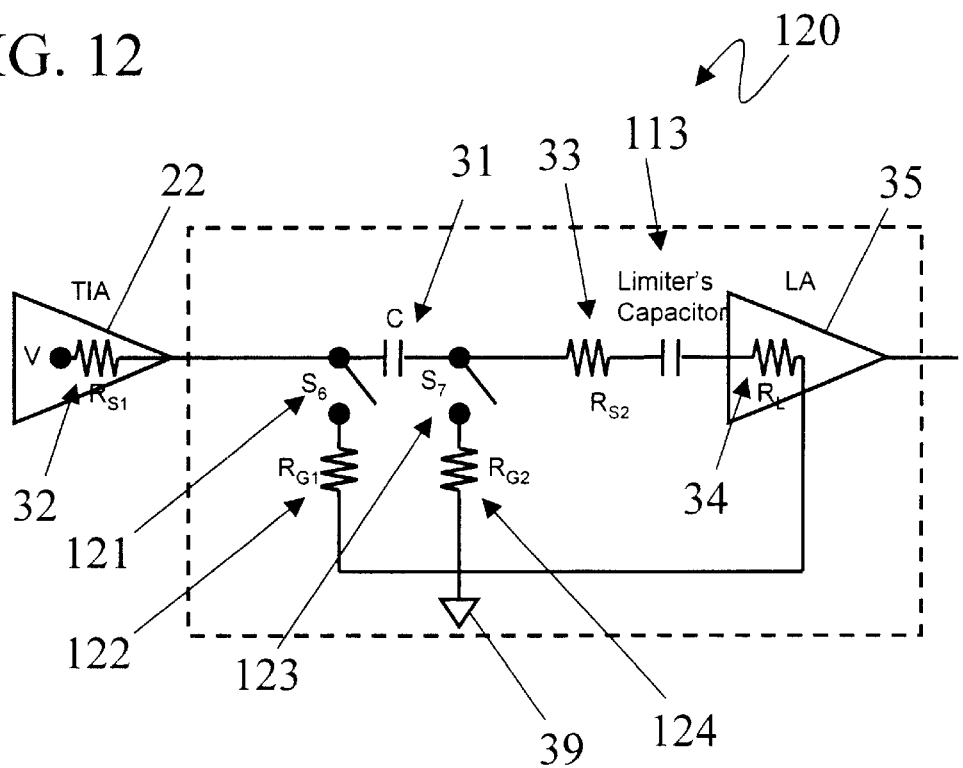
FIG. 12 presents a representative circuit diagram of an example limiter-amplifier device usable with burst mode communications, in accordance with a third embodiment of the present invention.

FIGS. 11 and 12 present additional embodiments of burst mode limiter-amplifier devices, in accordance with the present invention. In the embodiment shown in FIG. 1, in the device 110, the resistor $R_{S2}$ is placed between the capacitor 31 and the limiter-amplifier 35. A single pole switch $S_4$ 111 is placed between a first side of the capacitor 31 and ground 39, and a second single pole switch $S_5$ 112 is placed between the second side of the capacitor 31 and ground 39. In addition, a second capacitor 113, referred to in one embodiment as the "limiter's capacitor," is placed in series between the resistor $R_{S2}$ and the limiter-amplifier 35.

In operation, the embodiment of the device 110 of FIG. 11 proceeds through phases 1, 2, and 3, having similar functions as phases 1, 2, and 3, as described with regard to FIGS. 4, 5, and 7, above. In phase 1 (reset), switches $S_4$ 111 and $S_5$ 112 are placed in the closed position so as to discharge both sides of capacitor 31 to ground 39. In phase 2 (acquisition), switch $S_4$ 111 is placed in the open position, and switch $S_5$ 112 remains in the closed position, such that the capacitor 31 is charged to the threshold voltage. In phase 3, switches $S_4$ 111 and $S_5$ 112 are both placed in the open position, such that slow tracking occurs via the capacitors 31, 113 and the resistors $R_{S1}$, $R_{S2}$, $R_L$ in series through the device 110.

Similarly, in the embodiment shown in FIG. 12, in the device 120, the resistor $R_{S2}$ is placed between the capacitor 31 and the limiter-amplifier 35. A single pole switch $S_6$ 123 is placed in series with a resistor $R_{G1}$ 122 between a first side of the capacitor 31 and ground 39, and a second single pole switch $S_7$ 123 in series with a second resistor $R_{G2}$ 124 is placed between the second side of the capacitor 31 and ground 39. In addition the second capacitor 113 is placed in series between the resistor $R_{S2}$ and the limiter-amplifier 35.

In operation, the embodiment of the device 120 of FIG. 12 proceeds through phases 1, 2, and 3, having similar functions as described with regard to FIG. 11, above. In phase 1 (reset), switches $S_6$ 121 and $S_7$ 123 are placed in the closed position so as to discharge both sides of capacitor 31 to ground 39. In phase 2 (acquisition), switch $S_6$ 121 is placed in the open position, and switch $S_7$ 123 remains in the closed position, such that the capacitor 31 is charged to the threshold voltage. In phase 3, switches $S_6$ 121 and $S_7$ 123 are both placed in the open position, such that slow tracking occurs via the capacitors 31, 113 and the resistors $R_{S1}$, $R_{S2}$, $R_L$ in series through the device 120.

In this embodiment of the present invention, resistors $R_{G1}$ 122 and $R_{G2}$ 124 are placed in series with switches $S_6$ 121 and $S_7$ 123, respectively, and have appropriate minimum values selected so as to limit current through the switches, in accordance with current limitations for the switches. In addition, for example, the resistance of resistor $R_{G1}$ 121 can be selected so as to have a value equal to the value of resistor $R_{S2}$ 33, and such that, for example, a total resistance of about 50Ω exists in the circuit of the device 120, in both phase 2 and phase 3.

Figure 13:
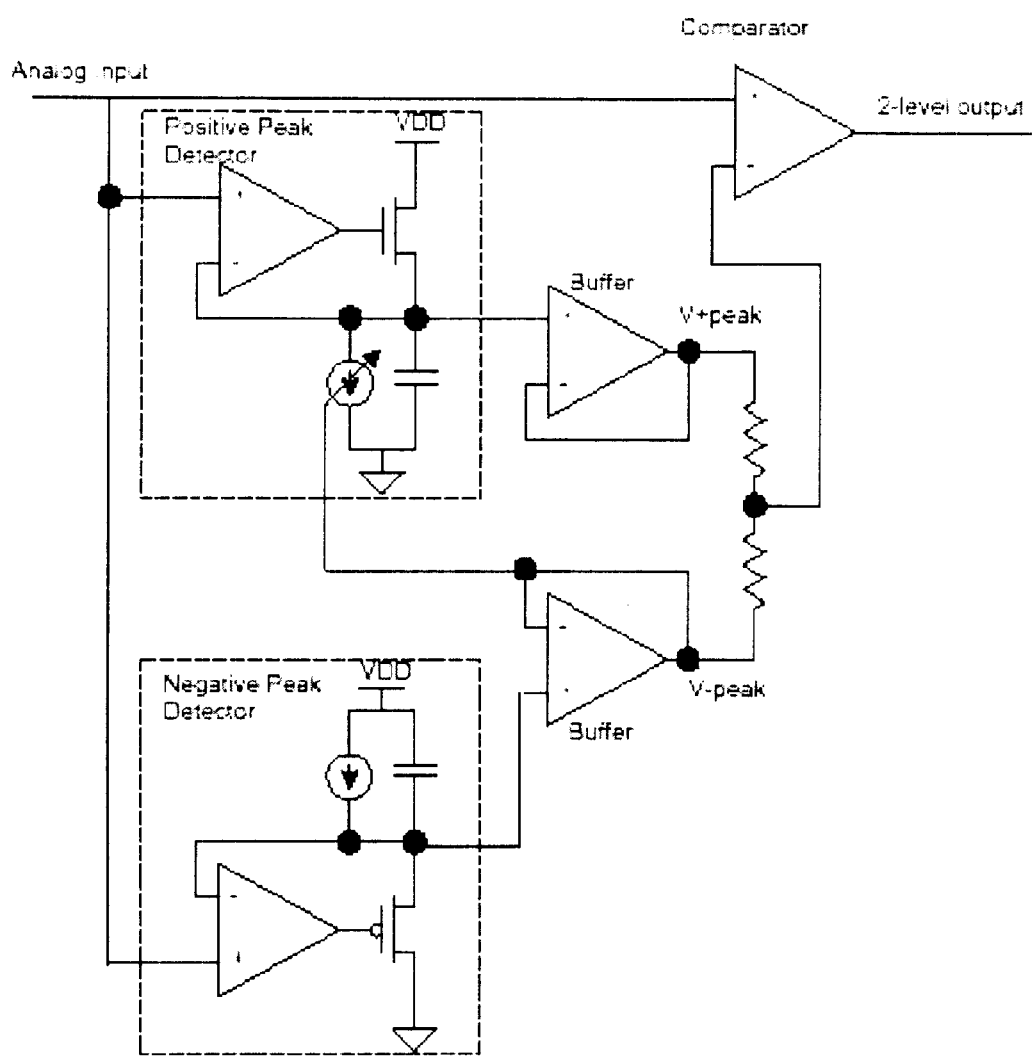
FIG. 13 shows a representative circuit diagram of an example limiter amplifier device having a current control attitude, in accordance with another embodiment of the present invention.
Figure 14:
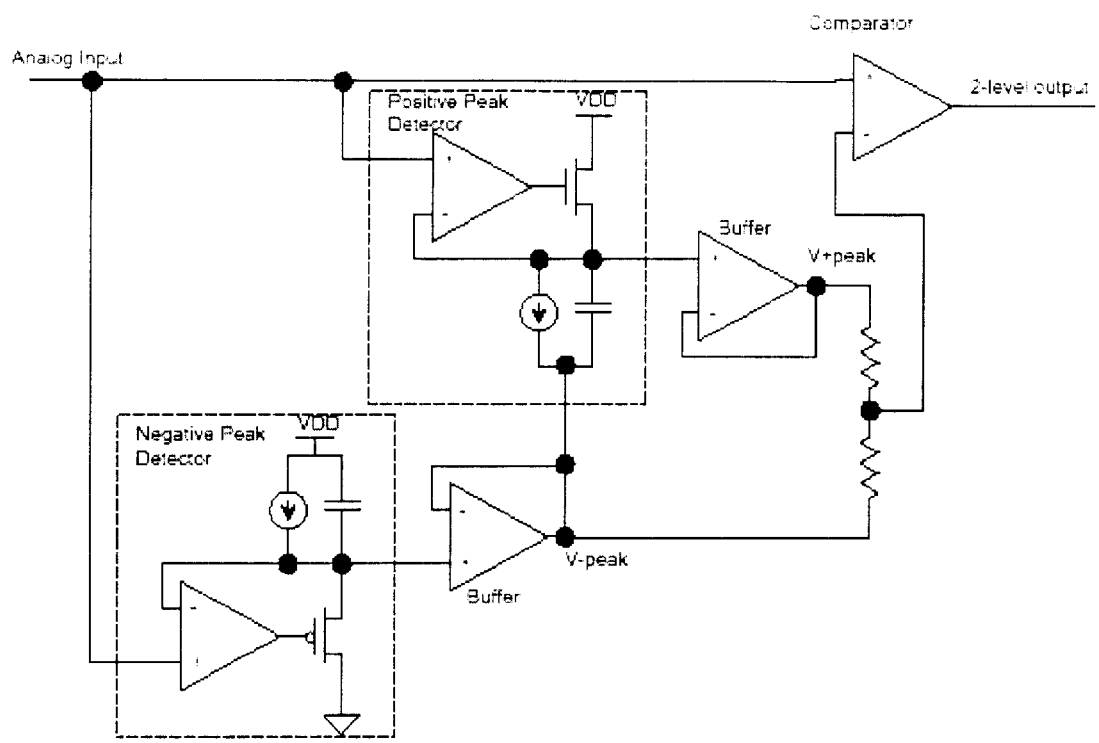
FIG. 14 contains a representative circuit diagram of an example limiter amplifier device having a differential attitude, in accordance with another embodiment of the present invention.

Acquisition of signal may similarly be variably controlled using other circuitry. For example, FIG. 13 shows a representative circuit diagram of an example limiter amplifier device having a current control attitude, in accordance with another embodiment of the present invention. In FIG. 13, the current source is controlled by the input of the negative peak detector, and the voltage at the negative peak detector, which is proportional to the tail strength, discharges the positive peak detector faster when the tail voltage is higher. FIG. 14 contains a representative circuit diagram of an example limiter amplifier device having a differential attitude, in accordance with another embodiment of the present invention. In FIG. 14, since the positive peak detector is connected to the negative peak detector output (instead of to ground), it works only on the difference between the signal and the output of the negative peak detector.

Figure 15:
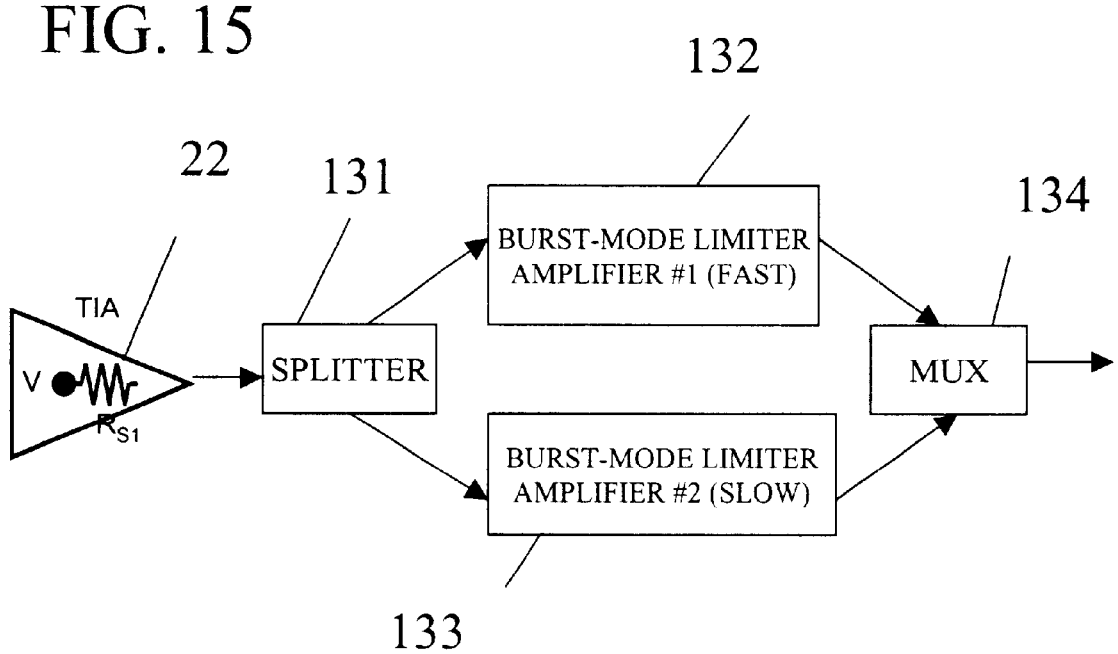
FIG. 15 presents a representative diagram of an example burst mode limiter-amplifier device incorporating a fast burst-mode limiter-amplifier, a slow burst-mode limiter-amplifier, and additional circuitry, in accordance with an embodiment of the present invention.

FIG. 15 presents a representative diagram of an example burst mode limiter-amplifier device incorporating a fast burst-mode limiter-amplifier 132, a slow burst-mode limiter-amplifier 133, and additional circuitry, in accordance with an embodiment of the present invention. This embodiment allows faster acquisition time. As shown in FIG. 15, the splitter 131 splits the power received from the TIA 22 into two paths. Each path provides an input to one of the two burst-mode limiter-amplifiers 132 and 133. The two parallel burst-mode limiter-amplifiers 132 and 133 differ by their time constant, which means that one burst-mode limiter-amplifier 132 (fast-tracking mode) can acquire the signal faster than the other burst-mode limiter-amplifier 133 (slow-tracking mode). This is achieved, for example, by having a lower value capacitor in burst-mode limiter-amplifier 132. Since the electrical levels at the burst-mode limiter-amplifiers' output are each digital (e.g., Emitter Coupled Logic (ECL), Positive Emitter Coupled Logic (PECL), or another digital interface), a multiplexing device 134, such as a digital multiplexer (MUX), is used to select between the two burst-mode limiter-amplifier outputs. The fast burst-mode limiter-amplifier 132 is selected at the beginning, during the preamble. This enables fast acquisition. Since the preamble typically does not include large sequences of consecutive identical bits, the short time constant does not adversely affect operation of the device during the preamble transmission period. Operation of the multiplexing device 134 is controlled, for example, by one or more control signals, similar to the control signals shown in FIG. 9 and described in accompanying text.

After the preamble has been transmitted, the slow burst-mode limiter-amplifier 133 is selected. At the switching point, the slow burst-mode limiter-amplifier 132 has already acquired the right values and output the correct data. In the above configuration, the limiter-amplifier described in FIG. 15 both acquires and outputs the correct data very fast. Also, during data reception, the device will not be sensitive to large sequences of consecutive identical bits.

Example embodiments of the present invention have now been described in accordance with the above advantages. It will be appreciated that these examples are merely illustrative of the invention. Many variations and modifications will be apparent to those skilled in the art.

What is claimed is:

1. A method of variably operating a burst mode limiter-amplifier device to amplify and limit a transmitted signal, wherein the burst mode limiter-amplifier device comprises a dischargeable capacitor, a bypassable resistor, and a limiter-amplifier having an inherent limiter-amplifier resistance, and wherein the limiter-amplifier is coupled in series with a received signal from a signal transmission device having an inherent signal transmission resistance, the method comprising the steps of:

discharging the capacitor;

charging the capacitor to a selected voltage, the selected voltage being between a high received signal voltage and a low received signal voltage; and for fast tracking of the transmitted signal, selectively coupling the capacitor in series with the inherent signal transmission resistance and the inherent limiter-amplifier resistance; and for slow tracking of the transmitted signal, selectively coupling the capacitor in series with the inherent signal transmission resistance, the inherent limiter-amplifier resistance, and the bypassable resistor.

2. A variable tracking burst mode limiter-amplifier device, comprising:

a resistor coupled in series with a capacitor having a first side and a second side;

a selectable resistor bypass circuit for selectably bypassing the resistor;

a signal transmission device coupled in series with the capacitor; and a limiter-amplifier coupled in series with the capacitor, the limiter-amplifier having an output for the device;

wherein the device is operable in a first tracking mode when the resistor is bypassed via the selectable resistor bypass circuit; and wherein the device is operable in a second tracking mode when the resistor is not bypassed via the selectable resistor bypass circuit.

3. The device of claim 2, further comprising:

a first capacitor side switch for selectively connecting the first side of the capacitor to a ground; and a second capacitor side switch for selectively connecting the second side of the capacitor to the ground.

4. A variable tracking burst mode limiter-amplifier device, comprising:

a bypassable resistor coupled to a signal source;

a capacitor coupled to the bypassable resistor; and a limiter-amplifier coupled to the capacitor;

wherein the variable trackina burst mode limiter-amplifier device is operable in a first tracking mode when the resistor is bypassed; and wherein the variable tracking burst mode limiter-amplifier device is operable in a second tracking mode when the resistor is not bypassed.

5. The variable tracking burst mode limiter-amplifier device of claim 4, wherein the first tracking mode is a fast tracking mode.

6. The variable tracking burst mode limiter-amplifier device of claim 4, wherein the second tracking mode is a slow tracking mode.

7. The variable tracking burst mode limiter-amplifier device of claim 4, further comprising:

a first capacitor side switch for selectively connecting the first side of the capacitor to a ground.

8. The variable tracking burst mode limiter-amplifier device of claim 4, further comprising:
a second capacitor side switch selectively connectable between the second side of the capacitor and a ground.

9. The variable tracking burst mode limiter-amplifier device of claim 8, wherein the second capacitor side switch is selectively connectable between the second side of the capacitor and the limiter-amplifier.

10. The variable tracking burst mode limiter-amplifier device of claim 4, wherein the bypassable resistor includes:
a resistor; and
a bypassing switch coupled in parallel with the resistor;
wherein closing the bypassing switch produces a short through the bypassing switch past the resistor.

11. A variable tracking burst mode limiter-amplifier device, comprising:
a capacitor having a side and a second side, the first side of the capacitor being coupled to a signal source;
a resistor coupled to the second side of the capacitor;
a limiter-amplifier coupled in series with the resistor, wherein the resistor is coupled between the limiter-amplifier and the second side of the capacitor;
a bypass switch coupled between the second side of the capacitor and a ground; and
a first capacitor side ground switch coupled between the first side of the capacitor and the ground;
wherein the device is resettable via closing of the bypass switch and closing of the first capacitor side ground switch; wherein the capacitor is chargeable to a threshold voltage via opening of the first capacitor side ground switch and closing of the bypass switch; and wherein the device is operable in a signal transmission mode via opening of the bypass switch and opening of the first capacitor side ground switch.

12. The device of claim 11, further comprising:
a first ground resistor in series with the first capacitor side ground switch between the first side of the capacitor and the ground.

13. The device of claim 11, further comprising:
a second ground resistor in series with the bypass switch between the second side of the capacitor and the ground.

14. The device of claim 11, further comprising:
a second capacitor coupled in series with the resistor and the limiter-amplifier, the second capacitor being coupled between the limiter-amplifier and the resistor.

15. A method for controlling three phases of operation of a limiter-amplifier device, the device including a bypassable resistor, a capacitor, and a limiter-amplifier, the method comprising:
in a first phase, transmitting a reset signal to a first switch, such that the first switch closes, shorting a first side of the capacitor to a ground; and transmitting an acquisition signal to a second switch and a third switch, such that the second switch opens and the resistor is not bypassed and the third switch shorts a second side of the capacitor to the ground;
in a second phase, ending transmission of the reset signal to the first switch, such that the first switch opens, removing the short of the second side of the capacitor to ground; and continuing the transmission of the acquisition signal to the second switch and the third switch; and
in a third phase, ending the transmission of the acquisition signal to the second switch and the third switch, such that the second switch closes, bypassably shorting past the resistor and the third switch couples the second side of the capacitor to the limiter-amplifier.

16. A variable tracking burst mode limiter-amplifier device, comprising:
a splitter for transmitting a single received signal to a first split signal output for a first split received signal and a second split signal output for a second split received signal;
a fast burst mode limiter amplifier coupled to the first split signal output for fast tracking the first split received signal to produce a fast burst mode transmitted signal;
a slow burst mode limiter amplifier coupled to the second split signal output for slow tracking the second split received signal to produce a slow burst mode transmitted signal; and
a multiplexing device coupled to the fast burst mode limiter amplifier and the slow burst mode limiter amplifier for providing an output from the received fast mode transmitted signal and the slow burst mode transmitted signal.

17. The device of claim 16, wherein the output includes the fast burst mode transmitted signal during an initial period and the slow burst mode transmitted signal following the initial period.

18. The device of claim 17, wherein the single received signal includes a preamble transmitted during a preamble period, and wherein the initial period is approximately the length of the preamble period.

19. The device of claim 16, wherein the fast burst mode limiter amplifier has an associated fast burst mode acquisition period, wherein the slow burst mode limiter amplifier has an associated slow burst mode acquisition period, and wherein the fast burst mode acquisition period is shorter than the slow burst mode acquisition period.

20. The device of claim 19, wherein the fast burst mode limiter amplifier has an associated fast burst mode limiter amplifier resistance and a fast burst mode limiter amplifier capacitance, and wherein the fast burst mode acquisition period is proportional to the product of the fast burst mode limiter amplifier resistance and the fast burst mode limiter amplifier capacitance.

21. The device of claim 20, wherein the fast burst mode limiter amplifier is selectively resettable.

22. The device of claim 21, wherein the fast burst mode limiter amplifier includes a fast burst mode limiter amplifier capacitor, and wherein the fast burst mode limiter amplifier is selectively resettable by grounding the fast burst mode limiter amplifier capacitor.

23. The device of claim 19, wherein the slow burst mode limiter amplifier has an associated slow burst mode limiter amplifier resistance and a slow burst mode limiter amplifier capacitance, and wherein the slow burst mode acquisition period is proportional to the product of the slow burst mode limiter amplifier resistance and the slow burst mode limiter amplifier capacitance.

24. A method for slow and fast tracking of received signals, comprising the steps of:
charging a capacitor to a threshold voltage, wherein said capacitor includes a first side and a second side, is connected in series on said first side to a source of received signals and connected in series on said second side to a limiter-amplifier; and
transmitting received signals from said source of received signals to said limiter-amplifier via a variable resistance path, wherein said variable resistance path comprises a bypassable resistor connected in series between said first side of said capacitor and said source of received signals;

wherein said variable resistance path is used to vary an acquisition time for the received signals, and wherein said acquisition time is a function of at least said threshold voltage and the resistance of said bypassable resistor.

25. The method of claim 24, further comprising the step of:

closing a switch disposed between said first side of said capacitor and said source of received signals, wherein the received signals transmitted from said source bypass said bypassable resistor, thereby allowing fast tracking of the preamble oft e received signals.

26. The method of claim 24, further comprising the step of:

opening a switch disposed between said first side of said capacitor and said source of received signals, wherein the received signals transmitted from said source do not bypass said bypassable resistor, thereby allowing slow tracking of the data within the received signals.

27. The method of claim 26, wherein said acquisition time, T, is proportional to the product of at least the resistance of said bypassable resistor, R, and the capacitance of said capacitor, C, thus satisfying the equation:

$$T \sim R*C.$$

28. The method of claims 24, wherein said second side of said capacitor is connected in series with said limiter-amplifier by switching a multiple pole switch to a switch position thereby closing a circuit between said second side of the capacitor and said limiter-amplifier.

* * * * *